(12) United States Patent
Chen et al.

(10) Patent No.: US 11,075,130 B2
(45) Date of Patent: Jul. 27, 2021

(54) PACKAGE SUBSTRATE HAVING POLYMER-DERIVED CERAMIC CORE

(71) Applicant: Intel Corporation, Santa Clara, CA (US)

(72) Inventors: Lisa Ying Ying Chen, Chandler, AZ (US); Lauren Ashley Link, Tempe, AZ (US); Robert Alan May, Chandler, AZ (US); Amruthavalli Pallavi Alur, Tempe, AZ (US); Kristof Kuwawi Darmawikarta, Chandler, AZ (US); Siddharth K. Alur, Chandler, AZ (US); Sri Ranga Sai Boyapati, Chandler, AZ (US); Andrew James Brown, Phoenix, AZ (US); Lilia May, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 16/481,216

(22) PCT Filed: Mar. 30, 2017

(86) PCT No.: PCT/US2017/025201
§ 371 (c)(1),
(2) Date: Jul. 26, 2019

(87) PCT Pub. No.: WO2018/182654
PCT Pub. Date: Oct. 4, 2018

(65) Prior Publication Data
US 2019/0393109 A1 Dec. 26, 2019

(51) Int. Cl.
*H01L 21/48* (2006.01)
*H01L 23/15* (2006.01)
(Continued)

(52) U.S. Cl.
CPC ........ *H01L 23/15* (2013.01); *C04B 35/62218* (2013.01); *C04B 35/64* (2013.01);
(Continued)

(58) Field of Classification Search
CPC . H01L 23/15; H01L 21/486; H01L 2924/181; H01L 2224/32225; H01L 2224/73204; C04B 35/571; C04B 41/87
See application file for complete search history.

(56) References Cited

U.S. PATENT DOCUMENTS 6,528,145 B1   3/2003  Berger et al.
6,828,224 B2   12/2004 Iijima et al.
(Continued)

FOREIGN PATENT DOCUMENTS

JP        2003-031719       1/2003

OTHER PUBLICATIONS

International Search Report and Written Opinion for International Patent Application No. PCT/US2017/025201 dated Dec. 28, 2017, 11 pgs.
(Continued)

*Primary Examiner* — Fernando L Toledo
*Assistant Examiner* — Valerie N Newton
(74) *Attorney, Agent, or Firm* — Schwabe, Williamson & Wyatt, P.C.

(57) ABSTRACT

Semiconductor packages including package substrates having polymer-derived ceramic cores are described. In an example, a package substrate includes a core layer including a polymer-derived ceramic. The polymer-derived ceramic may include filler particles to control shrinkage and reduce warpage of the core layer during fabrication and use of the package substrate. The core layer may include counterbores or blind holes to embed a contact pad or an electrical interconnect in the core layer. A semiconductor die may be (Continued)

mounted on the package substrate and may be electrically connected to the contact pad or the electrical interconnect.

20 Claims, 8 Drawing Sheets (51) Int. Cl.
    *C04B 35/622* (2006.01)
    *C04B 35/64* (2006.01)
    *H01L 23/498* (2006.01)
    *G03F 7/16* (2006.01)
    *G03F 7/20* (2006.01)
    *G03F 7/32* (2006.01)

(52) U.S. Cl.
    CPC ...... *H01L 21/486* (2013.01); *H01L 23/49827* (2013.01); *H01L 23/49838* (2013.01); *C04B 2235/48* (2013.01); *C04B 2235/6026* (2013.01); *G03F 7/16* (2013.01); *G03F 7/2002* (2013.01); *G03F 7/322* (2013.01); *H01L 23/49816* (2013.01)

(56) References Cited

U.S. PATENT DOCUMENTS

2005/0287714 A1  12/2005  Walk et al.
2015/0334823 A1  11/2015  Hu
2016/0240481 A1   8/2016  Chen et al.

OTHER PUBLICATIONS

International Preliminary Report on Patentability for International Patent Application No. PCT/US2017/025201, dated Oct. 10, 2019, 8 pgs.

Figure 1

DETAIL A

Figure 2

DETAIL A

PACKAGE SUBSTRATE HAVING POLYMER-DERIVED CERAMIC CORE

CROSS-REFERENCE TO RELATED APPLICATION

This patent application is a U.S. National Phase Application under 35 U.S.C. § 371 of International Application No. PCT/US2017/025201, filed Mar. 30, 2017, entitled "PACKAGE SUBSTRATE HAVING POLYMER-DERIVED CERAMIC CORE," which designates the United States of America, the entire disclosure of which is hereby incorporated by reference in its entirety and for all purposes.

FIELD OF THE INVENTION

Embodiments are in the field of integrated circuit packages and, in particular, semiconductor packages including a package substrate having a core layer.

BACKGROUND OF THE INVENTION

Semiconductor package requirements continue to trend toward thinner package profile specifications. Thinner package profiles can be achieved by reducing a thickness of a package substrate of the semiconductor package. The thickness of a package substrate, however, corresponds to a resistance of the package substrate to warpage, and thus, thinner package substrates tend to warp during fabrication and use. When package substrates are formed from traditional substrate materials, warpage can be controlled by lowering a coefficient of thermal expansion (CTE), increasing a stiffness, or increasing a glass transition temperature ($T_g$) of the package substrate component, e.g., a core layer of the substrate.

The CTE of traditional core layer materials has already been driven below 5 ppm/° C., yet the relative CTEs of the overall package substrate and that of a semiconductor die mounted on the package substrate remain mismatched. Accordingly, warpage in package substrates is common, especially when the substrate has a thicknesses less than 300 microns. This persistent warpage indicates that improvements in CTE alone will not solve the warpage issue. Manufacturing processes, such as flip flattening processes, have been developed to control warpage of the packages substrate. Also, stiffener attachments have been used to lend strength to the package substrate. For example, stiffener layers attached to the package substrate, or glass cloth fibers embedded in a core material or buildup dielectric material of the substrate, have been explored as potential remedies for package substrate warpage.

DETAILED DESCRIPTION OF THE INVENTION

Semiconductor packages including package substrates having polymer-derived ceramic cores are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

Flattening processes and stiffener attachments for controlling package substrate warpage have been shown to have insufficient margins against bending and/or to unacceptably increase a thickness of the package substrate. These issues are compounded in certain applications, such as antenna array structures that require asymmetric stack-ups with large dielectric thickness imbalances on opposite sides of a core layer of the package substrate. In such cases, stress imbalances between dielectric layers on the opposite sides can aggravate warpage of the package substrate. Accordingly, the thinner that package substrates become, the more susceptible the package substrates are to bending, when traditional core layer materials are used. Bending can lead to poor mounting of semiconductor dies on the package substrate, and reduced robustness of the semiconductor package.

In an aspect, a thin and very stiff package substrate is provided. The package substrate may include a core layer having a polymer-derived ceramic. Polymer-derived ceramics have a very low CTE (comparable to silicon), and if used for substrate cores, can lower the overall substrate CTE and stiffen the package substrate against bending without sacrificing z-height. For example, the core layer having a polymer-derived ceramic can have a layer thickness of less than 100 microns. Polymer-derived ceramics exhibit greater toughness than traditional ceramics, and thus, may be used in a semiconductor package assembly without fracturing during fabrication or use. Furthermore, the fabrication of a core layer using polymer-derived ceramics, as described below, can achieve patterned features, e.g., through-holes or blind holes, on a scale that is unattainable using traditional ceramics. Accordingly, a package substrate including a core layer having a polymer-derived ceramic may resist warpage or bending during fabrication or use, and can enable future package applications, such as asymmetric antenna array packages.

Figure 1:
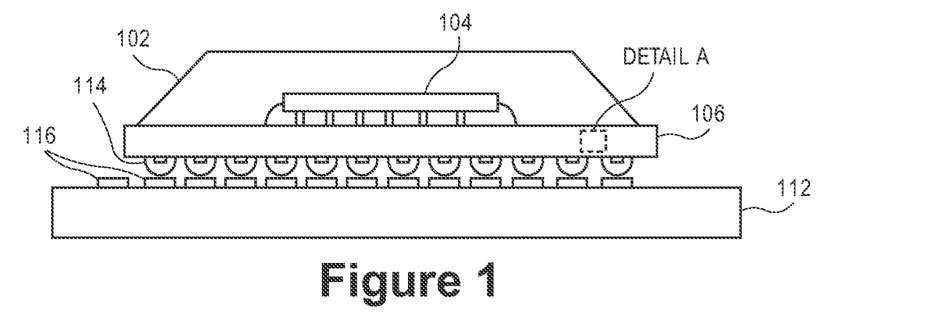
FIG. 1 illustrates a sectional view of a semiconductor package assembly, in accordance with an embodiment.

Referring to FIG. 1, a sectional view of a semiconductor package assembly is illustrated in accordance with an embodiment. A semiconductor package assembly 100 may include one or more semiconductor packages 102 having integrated dies in communication with each other or other components of the assembly. In an embodiment, semiconductor package 102 is a system having a semiconductor die 104, e.g., a memory die, mounted on a package substrate 106. Semiconductor die(s) 104 may be connected to other dies and to conductive components of package substrate 106 by electrical interconnects. The electrical interconnects may be, for example, wire bonds or electrical bump interconnects. The electrical interconnects may include vias and traces within package substrate 106, as described below.

In an embodiment, package substrate 106 may be mounted on a circuit board 112. For example, semiconductor package 102 of semiconductor package assembly 100 may be a ball grid array (BGA) component having several solder balls 114 arranged in a ball field. That is, an array of solder balls 114 may be arranged in a grid or other pattern. Each solder ball 114 may be mounted and attached to a corresponding contact pad 116 of circuit board 112. Circuit board 112 may be a motherboard or another printed circuit board of a computer system or device. Circuit board 112 may include signal routing to external device connectors (not shown). Accordingly, the solder ball and contact pad attachments may provide a physical and electrical interface between the dies of semiconductor package 102 and an external device.

In an embodiment, semiconductor package 102 includes package substrate 106 having several layers. Package substrate 106 may have a core layer between one or more insulating or conductive planar layers, as is known in the art. The core layer may have an increased stiffness and reduced CTE as compared to traditional substrate core materials. More particularly, the core layer may include a polymer-derived ceramic. It will be appreciated that, although the description below focuses on the core layer of package substrate 106, the stiff substrate layer may be incorporated in other components of semiconductor package assembly 100. For example, circuit board 112 may include a layer having a polymer-derived ceramic.

Figure 2:
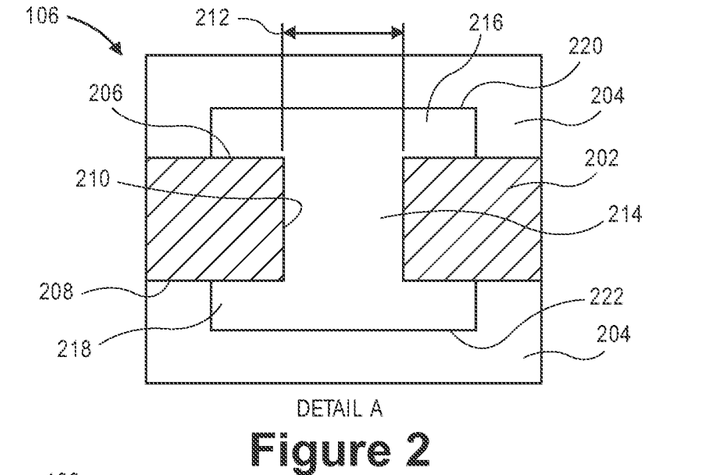
FIG. 2 illustrates a detail view taken from Detail A of FIG. 1, of a package substrate having a polymer-derived ceramic core layer, in accordance with an embodiment.

Referring to FIG. 2, a detail view taken from Detail A of FIG. 1, of a package substrate having a polymer-derived ceramic core layer is shown in accordance with an embodiment. Package substrate 106 may include a core layer 202 within a laminate structure. In an embodiment, core layer 202 includes a polymer-derived ceramic. One or more dielectric layer 204 may be layered over core layer 202. For example, a first dielectric layer 204 may be on a top core surface 206 of core layer 202, and a second dielectric layer 204 may be on a bottom core surface 208 of core layer 202.

Core layer 202 may include a through-hole 210 extending from top core surface 206 to bottom core surface 208. Through-hole 210 may be fabricated by patterning core layer 202 during formation of the polymer-derived ceramic, as described below. The patterning process may allow through-hole 210 to be formed at a scale smaller than features that can be added to traditional ceramic materials. For example, through-hole 210 may have a hole diameter 212 of less than 100 microns.

Through-hole 210 may provide an electrical connection between substrate structures above core layer 202 and substrate structures below core layer 202. More particularly, a conductive interconnect 214 may be located in through-hole 210 and extend through the polymer-derived ceramic of core layer 202 from a top pad 216 to a bottom pad 218.

Conductive interconnect 214 may be a barrel of a via extending from a plane or trace above core layer 202 to a plane or trace below core layer 202. Similarly, top pad 216 may be an electrical contact between the upper plane or trace and conductive interconnect 214, and bottom pad 218 may be an electrical contact between the lower plane or trace and conductive interconnect 214. The pads 216, 218 may have outer dimensions, e.g., pad diameters, greater than an outer dimension of conductive interconnect 214, e.g., hole diameter 212.

Dielectric layer 204 above core layer 202 may cover the via. Dielectric layer 204 may be laminated over a top pad surface 220 of top pad 216, and may cover conductive interconnect 214. Similarly, dielectric layer 204 below core layer 202 may be laminated over a bottom pad surface 222 of bottom pad 218, and may cover conductive interconnect 214. Accordingly, the via may be surrounded by core layer 202 and dielectric layers 204.

Figure 3:
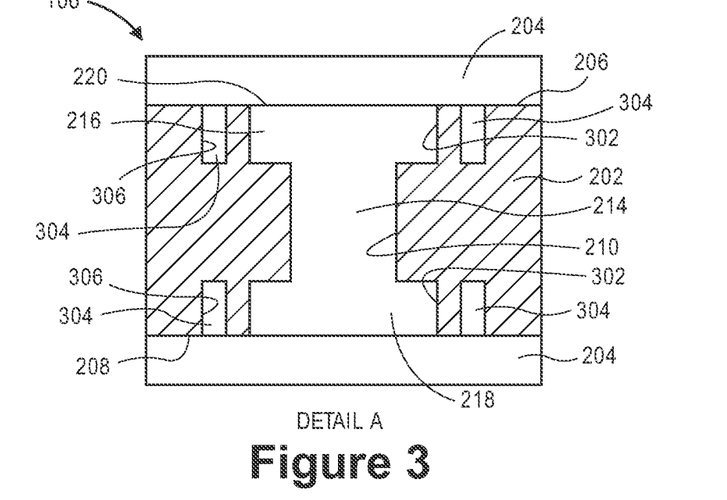
FIG. 3 illustrates a detail view taken from Detail A of FIG. 1, of a package substrate having a polymer-derived ceramic core layer having an embedded contact pad, in accordance with an embodiment.

Referring to FIG. 3, a detail view taken from Detail A of FIG. 1, of a package substrate having a polymer-derived ceramic core layer having an embedded contact pad is shown in accordance with an embodiment. One or more electrical interconnects 304 may be embedded within core layer 202. Conductive interconnect 214 may extend within through-hole 210 in a middle portion of core layer 202. Through-hole 210 may include a counterbore 302. Counterbore 302 may be a concentric hole having a larger hole diameter than through-hole 210. Top pad 216 may be located in counterbore 302. Bottom pad 218 may be similarly located in a counterbore 302 in a bottom portion of core layer 202. Accordingly, conductive interconnect 214 may include one or more pads in corresponding counterbores 302.

In an embodiment, counterbore 302 is recessed within core layer 202 such that top pad 216 (or bottom pad 218) is embedded within core layer 202. Top pad 216 may be partially embedded within core layer 202. For example, top pad surface 220 may remain above top core surface 206. In an embodiment, top pad 216 is fully embedded within core layer 202. That is, top pad surface 220 of top pad 216 may be coplanar with top core surface 206. Similarly, bottom pad 218 may be partially or fully embedded in a bottom portion of core layer 202.

An electrical interconnect 304 may be embedded within core layer 202 lateral to top pad 216 or bottom pad 218. Electrical interconnect 304 may be a trace, for example, extending from a corresponding pad along a plane within core layer 202. In an embodiment, core layer 202 includes a blind hole 306. For example, blind hole 306 may extend from top core surface 206 into the polymer-derived ceramic of core layer 202. Blind hole 306 may have a depth less than a thickness of core layer 202. By way of example, core layer 202 may have a thickness of a less than 100 microns, e.g., 90 microns, and blind hole 306 may have a depth of less than 50 microns, e.g., 30 microns. Blind holes 306 may extend downward from top core surface 206 or upward from bottom core surface 208 to receive corresponding electrical interconnects 304. Thus, electrical interconnect 304 may be disposed within blind hole 306 in an upper portion of core layer 202 or within blind hole 306 in a lower portion of core layer 202. Electrical interconnect 304 may be partially or fully embedded within core layer 202. That is, electrical interconnect 304 may have an outer surface (top or bottom surface) extending above or below a corresponding surface 206, 208, or coplanar with a corresponding surface 206, 208.

Semiconductor die 104 mounted on package substrate 106 may be electrically connected to conductive interconnect 214 and/or electrical interconnects 304. For example, electrical bumps of die 104 may transmit or receive electrical signals through conductive traces and vias in package substrate 106. Accordingly, die 104 may communicate with circuit board 112 through electrical interconnect 304 and/or conductive interconnect 214 in core layer 202 having polymer-derived ceramic.

A method of fabricating the structures of FIGS. 2-3 can include forming core layer 202 from a polymer-derived ceramic. The polymer-derived ceramic may have low shrinkage, high toughness, and fine patterning resolution. Accordingly, the polymer-derived ceramic may differ from traditional ceramic materials at least in that the polymer-derived ceramic overcomes prior limitations of ceramic materials. For example, whereas traditional ceramic materials, such as ceramic-derived alumina, may not achieve holes having hole diameters less than 100 microns, or may not be patterned using photolithography, polymer-derived ceramic materials fabricated using photolithography techniques as described below can include through-hole 210 having hole diameter 212 less than 25 microns, e.g., on a scale of 10 microns. For example, hole diameter 212 may be 10 microns or less.

Figure 4:
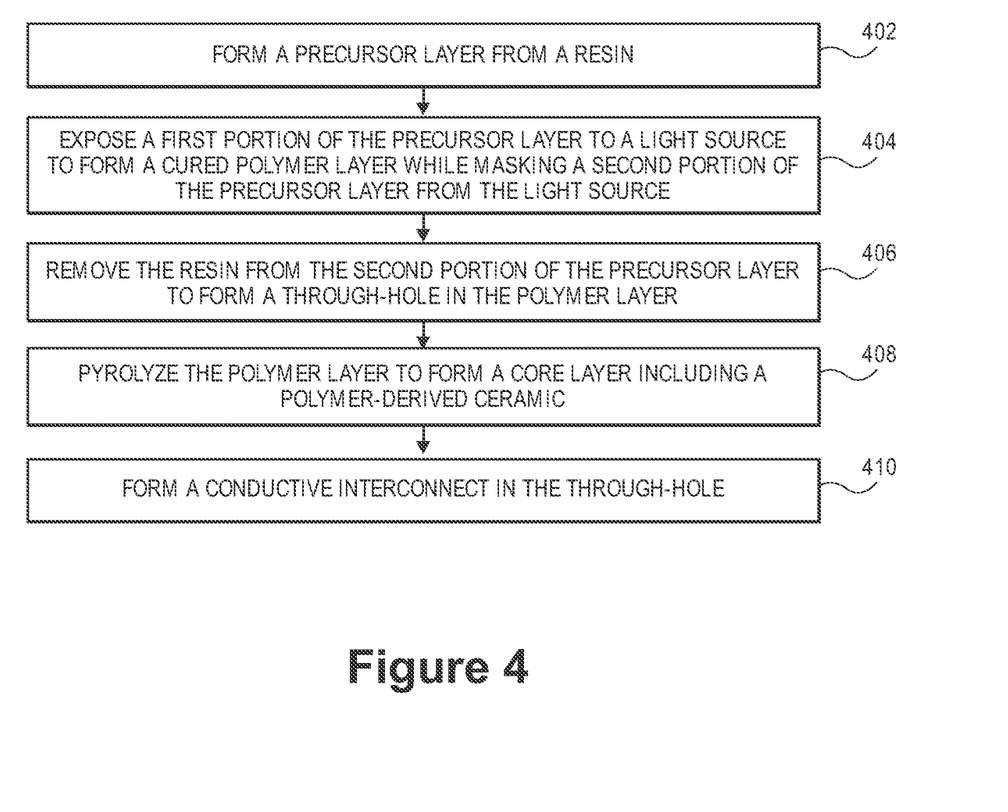
FIG. 4 illustrates a method of fabricating a package substrate having a polymer-derived ceramic core layer, in accordance with an embodiment.
Figure 5A:
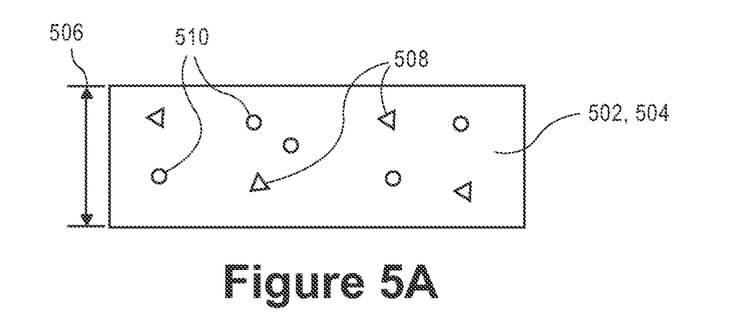
FIGS. 5A-5E illustrate operations in a method of fabricating a package substrate having a polymer-derived ceramic core layer, in accordance with an embodiment.

Referring to FIG. 4, a method of fabricating a package substrate having a polymer-derived ceramic core layer is shown in accordance with an embodiment. FIGS. 5A-5E illustrate operations in the method of FIG. 4. Accordingly, FIGS. 4-5E are described in combination below. The method of FIG. 4 can yield package substrate 106 as shown in FIG. 2.

Polymer-derived ceramics may start as a polymer resin having organic groups connected to a backbone of inorganic materials. Referring to FIG. 5A, at operation 402, a precursor layer 502 is formed from the polymer resin. More particularly, precursor layer 502 is formed from a resin 504 containing the polymer in an uncured state. The uncured resin 504 can be laminated as a thin film. The resin 504 may include several polymers attached as side-chains to an inorganic backbone having functional groups, e.g., silazane or siloxane. The functional groups of the polymer side-chains may be cross-linking groups that can bind to each other to form the polymer networks when activated.

Precursor layer 502 may have a layer thickness 506 corresponding to a thickness of core layer 202 in a finished package substrate 106. For example, core layer 202 may have a layer thickness of less than 100 microns, and accordingly, layer thickness 506 of precursor layer 502 may equal the layer thickness of core layer 202 plus any shrinkage from the fabrication process. By way of example, shrinkage may be in a range up to 40%, e.g., 10%, and thus, layer thickness 506 of precursor layer 502 may be up to 40% greater than the layer thickness of core layer 202.

In an embodiment, resin 504 includes additives. For example, resin 504 may include several filler particles 508 dispersed within the resin matrix. Filler particles 508 in resin 504, and ultimately in the polymer-derived ceramic of core layer 202, may include oxides. For example, filler particles 508 may be silica or alumina particles. Filler particles 508 may act as a static volume around which resin 504 shrinks during the fabrication process, as described below. Filler particles 508 may also be active filler particles 508 that expand while other portions of resin 504 shrink. For example, active fillers may react with volatilized products from resin 504 and expand in volume via formation of new compounds. The expanding filler can in turn fill free volume resulting from the removal of other compounds, e.g., volatile compounds in resin 504. Accordingly, filler particles 508 may reduce shrinkage of precursor layer 502 during a transition of precursor layer 502 into core layer 202. Furthermore, filler particles 508 may reduce a formation of voids or weak points that could lead to brittle fracture of the finished core layer 202. Accordingly, core layer 202 having polymer-derived ceramics that include filler particles 508 can exhibit higher toughness as compared to traditional ceramic materials.

Resin 504 may also include additives to facilitate polymerization of precursor layer 502 into a cross-linked polymer layer 516. The additives may promote cross-linking upon exposure to light or heat, as an example. For example, the additives may include thermal initiators, such as platinum particles. In an embodiment, resin 504 includes a photoinitiator 510 that is activated by a light source, e.g., ultraviolet light. Accordingly, the polymer-derived ceramic of core layer 202 may include photoinitiator 510.

Figure 5B:
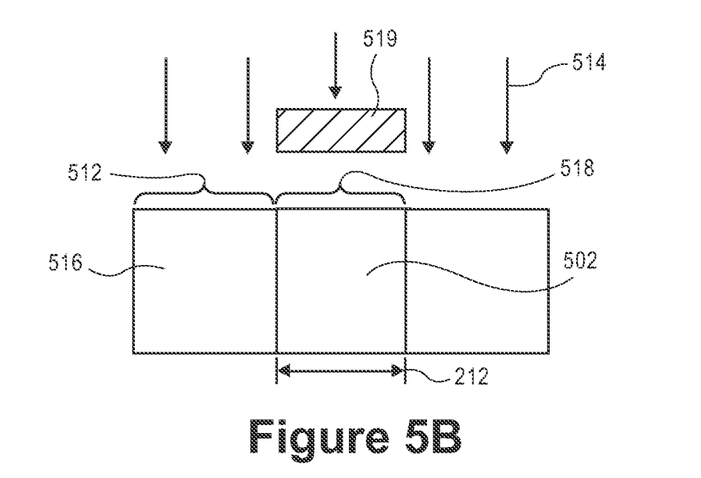

Referring to FIG. 5B, at operation 404, a first portion 512 of precursor layer 502 is exposed to a light source 514 to convert precursor layer 502 into a cross-linked polymer layer 516 in a cured state, i.e., a cured polymer layer. In an embodiment, the precursor layer is a polymer, and the precursor layer is converted into a cross-linked polymer network upon curing. Light source 514 may be directed onto first portion 512 while a second portion 518 of precursor layer 502 is masked. For example, a mask 519 having a cross-sectional area of a desired hole diameter 212 of through-hole 210 may be placed between light source 514 and precursor layer 502 during the exposure operation. Mask 519 can block light to define an exposure pattern. Accordingly, light source 514 may activate resin 504 to cross-link the polymer chains in first portion 512 into cross-linked polymer network layer 516, and resin 504 within second portion 518 may remain uncured. When precursor layer 502 is a thin film, e.g., having layer thickness 506 of 100 microns or less, light source 514 can penetrate through the entire thickness to produce a through-hole pattern under mask 519.

Figure 5C:
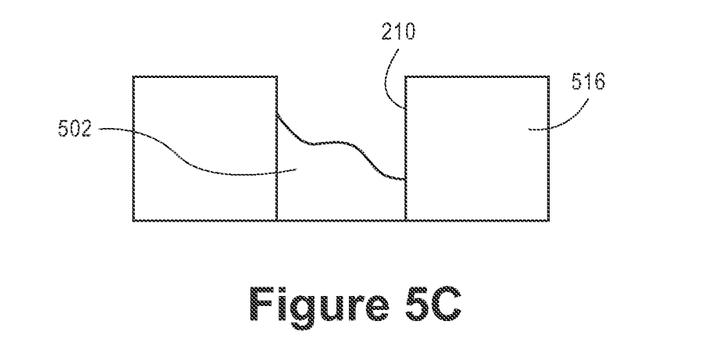

Referring to FIG. 5C, at operation 406, the uncured resin 504 is removed from second portion 518 of precursor layer 502 to form through-hole 210 in cured polymer layer 516. The precursor layer 502 can be developed away with solution, leaving behind the cured polymer layer 516 having photolithography-formed features. For example, a solvent may be applied to the uncured resin 504 in second portion 518 to wash the resin 504 out of through-hole 210.

The photolithography technique applied to precursor layer 502 can form fine features, e.g., micron scale features, in core layer 202. As described above, hole diameter 212 can be less than 100 microns, e.g., on a scale of 10 microns. For example, hole diameter 212 can be 10 microns or less. Lasers, e.g., CO2 or UV lasers, may be used to form holes having diameters less than 100 microns in traditional ceramic materials, however, laser processes are relatively slow as compared to photolithographic patterning processes. Furthermore, laser processes require more energy, and such processes cannot be used to form holes having diameters on a scale of 10 microns or less. Through-holes 210 in polymer layer 516 may also have vertical walls, which can be distinguished from the tapered walls evident in holes formed by, e.g., a laser-drilling process. Polymer layer 516 may be a cured green body having cross-linked functional groups and organic material.

Figure 5D:
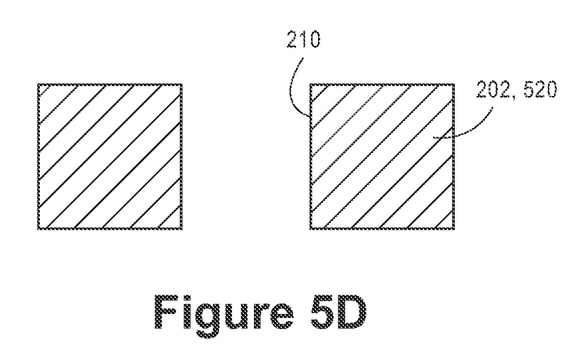
Figure 5E:
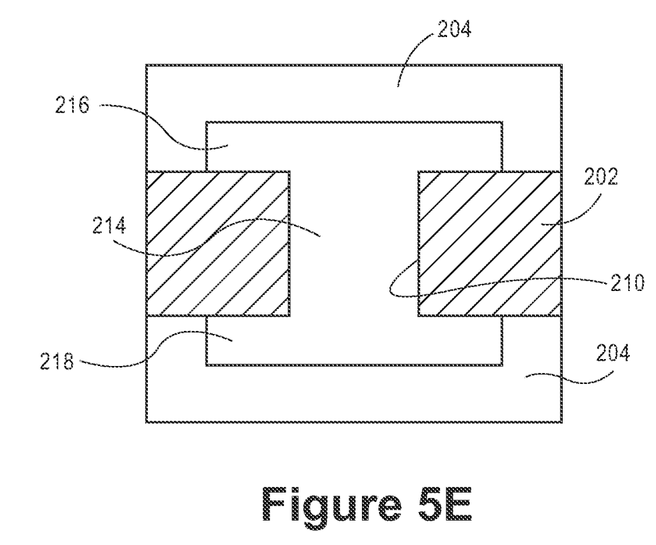

Referring to FIG. 5D, at operation 408, polymer layer 516 may be pyrolyzed to form core layer 202 including a polymer-derived ceramic 520. Pyrolysis can include heating the cured green body to elevated temperatures, e.g., above 400° C. During pyrolysis, organic material in the cured green body is volatilized and removed from polymer layer 516. The inorganic components of the starting resin 504 remain behind. For example, core layer 202 can include the constituents of the inorganic backbone in resin 504, e.g., Si, B, N, O, or C. The remaining materials in core layer 202 yield a ceramic chemistry derived from the backbone, i.e., a polymer-derived ceramic 520. For example, the polymer-derived ceramic 520 in core layer 202 may be SiC, BN, or SiOC. Core layer 202 may still have some organic polymer content remaining after pyrolysis. For example, partial pyrolysis may be performed, and may be beneficial to achieve ceramic-like properties while minimizing shrinkage and increasing toughness.

Shrinkage during pyrolysis of polymer layer 516 can be up to 40% by volume. Shrinkage may introduce pores and other structural flaws into core layer 202, which can promote brittle fracture of core layer 202. Techniques for controlling shrinkage may be introduced to improve core layer toughness. In an embodiment, shrinkage of polymer layer 516 during pyrolysis may be controlled by applying pressure to polymer layer 516. For example, pressure may be applied normal to a lateral plane of polymer layer 516 to reduce shrinkage in the lateral direction to less than 10%. Shrinkage may be reduced in both the lateral direction, and in a direction normal to the core layer plane, using filler particles 508.

Filler particles 508 may act as reinforcements to help mitigate shrinkage and improve mechanical toughness of core layer 202 after pyrolysis. At the pyrolyzing stage, static filler particles 508 may provide a static volume that does not change through chemical reaction during pyrolysis. Thus, polymer layer 516 may shrink around the static filler particles 508, but overall shrinkage of polymer layer 516 may be reduced as compared to polymer layer 516 having no filler particles 508. Alternatively, active fillers that react with the organic products of pyrolysis can change volume to fill in areas of core layer 202 that would otherwise become voids. Active filler particles 508 can expand while other areas of polymer layer 516 shrink to provide a net zero volume change in polymer layer 516, or a reduced shrinkage as compared to polymer layer 516 having no filler particles 508. The finished core layer 202 having a polymer-derived ceramic 520 with reduced voiding can have higher toughness than traditional ceramic materials. In addition to increased toughness, core layer 202 can have a high modulus, e.g., greater than 50 GPa, and a low CTE, e.g., less than 5 ppm/° C. Thus, core layer 202 having a polymer-derived ceramic 520 can serve as a stiff and strong substrate for building up dielectric and conductive layers of package substrate 106.

Referring to FIG. 5E, core layer 202 can proceed to metal patterning and dielectric buildup operations. For example, at operation 410, conductive interconnect 214 can be formed in through-hole 210. Metallization of the via in through-hole 210 can be performed using known processes. Similarly, dielectric layers 204 can be laminated over core layer 202 to yield the structure described with respect to FIG. 2.

Figure 6:
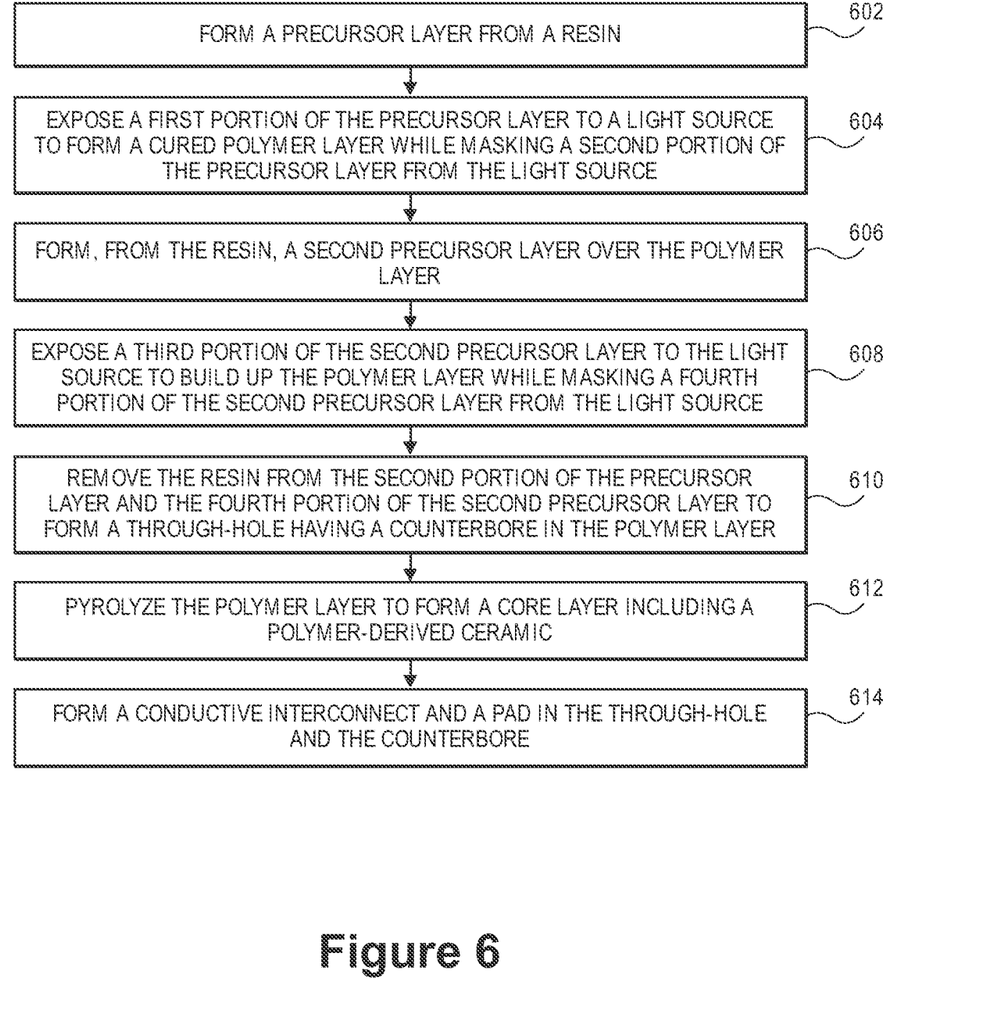
FIG. 6 illustrates a method of fabricating a package substrate having a contact pad embedded in a polymer-derived ceramic core layer, in accordance with an embodiment.

Referring to FIG. 6, a method of fabricating a package substrate having a contact pad embedded in a polymer-derived ceramic core layer is shown in accordance with an embodiment. FIGS. 7A-7E, illustrate operations in the method FIG. 6. Accordingly, FIGS. 6-7E are described in combination below. The method of FIG. 6 can yield package substrate 106 as shown in FIG. 3. More particularly, the method may yield a ceramic core having an embedded conductive pad or trace.

In an embodiment, a first layer 702 may be formed using operations 402 to 404, as described above. More particularly, first layer 702 may include precursor layer 502 in the uncured state within polymer layer 516 in the cured state. Accordingly, at operation 602, precursor layer 502 may be formed from resin 504, and at operation 604, first portion 512 of precursor layer 502 may be exposed to light source 514 to form polymer layer 516 while masking second portion 518 of precursor layer 502. That is, operation 602 may map to operation 402, and operation 604 may map to operation 404.

Figure 7A:
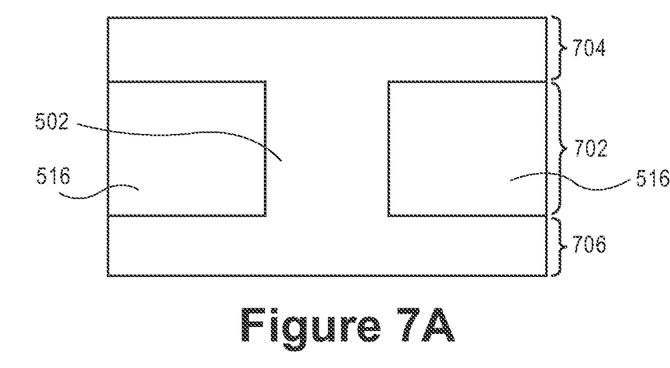
FIGS. 7A-7E illustrate operations in a method of fabricating a package substrate having a contact pad embedded in a polymer-derived ceramic core layer, in accordance with an embodiment.

Referring to FIG. 7A, at operation 606, a second precursor layer 704 may be formed from resin 504 over first layer 702. Second precursor layer 704 may be deposited as a thin film of uncured resin 504 covering polymer layer 516 and precursor layer 502. Second precursor layer 704 may be deposited on a top side of first layer 702. In an embodiment, a third precursor layer 706 may be laminated over a bottom side of first layer 702. More particularly, third precursor layer 706 may be formed from uncured resin layered over polymer layer 516 and precursor layer 502. The resulting stack up of precursor layers can include the cured polymer layer 516 having a profile of through-hole 210 extending between second precursor layer 704 and third precursor layer 706.

Figure 7B:
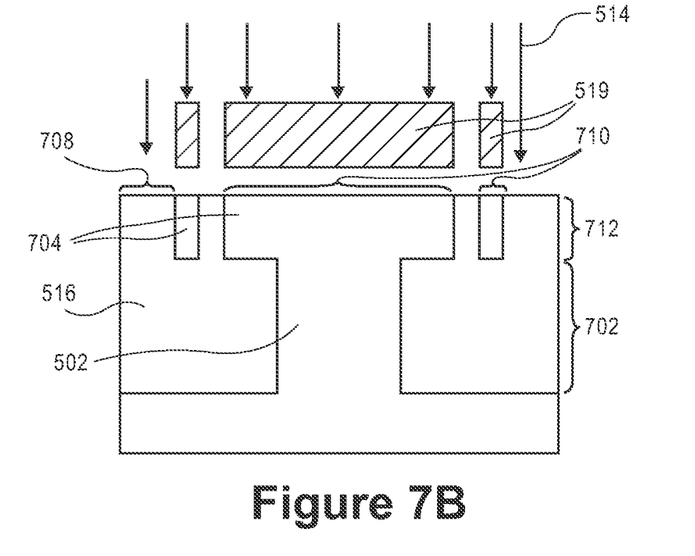

Referring to FIG. 7B, at operation 608, a third portion 708 of second precursor layer 704 is exposed to light source 514 while masking a fourth portion 710 of second precursor layer 704 by mask 519. Mask 519 controls the patterning of second precursor layer 704 such that resin 504 in the exposed third portion 708 converts to cured polymer. Accordingly, polymer layer 516 is built up. That is, polymer layer 516 can extend within both first layer 702 and within a second layer 712 of the stack up containing second precursor layer 704. The uncured fourth portion 710 can include a region of the stack up corresponding to counterbore 302 and/or blind hole 306. For example, fourth portion 710 over precursor layer 502 can correspond to counterbore 302. Similarly, fourth portion 710 lateral to the counterbore 302 region can correspond to blind hole 306.

Figure 7C:
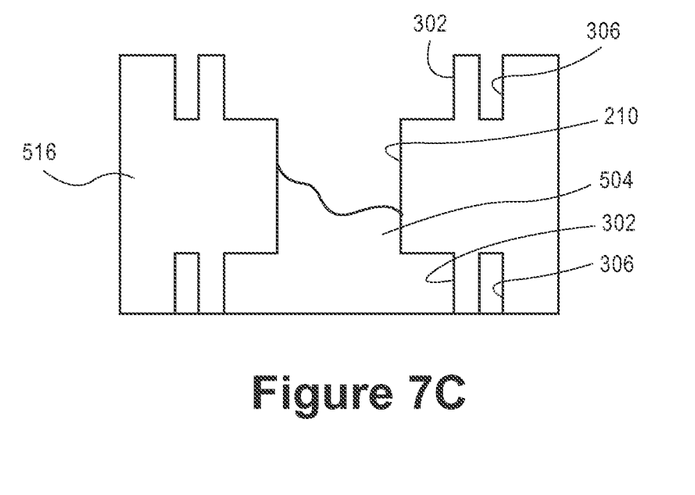

Referring to FIG. 7C, at operation 610, resin 504 is removed from first layer 702 and second layer 712 to form features in polymer layer 516. A development solution may wash out resin 504 from the uncured precursor layer 502 of first layer 702, and from the uncured fourth portion 710 of second precursor layer 704 above the uncured precursor layer 502 to form through-hole 210 and counterbore 302. Similarly, the development solution may wash out resin 504 of the uncured fourth portion 710 lateral to counterbore 302 to form blind hole(s) 306 in polymer layer 516.

Figure 7D:
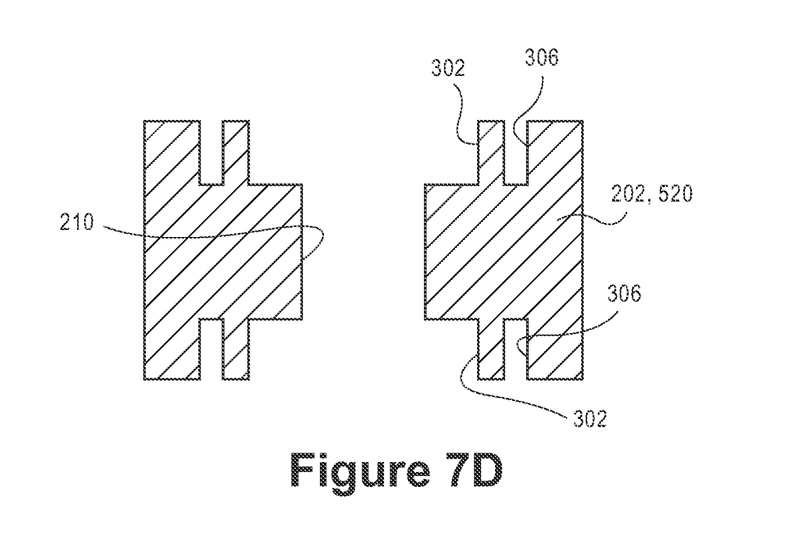
Figure 7E:
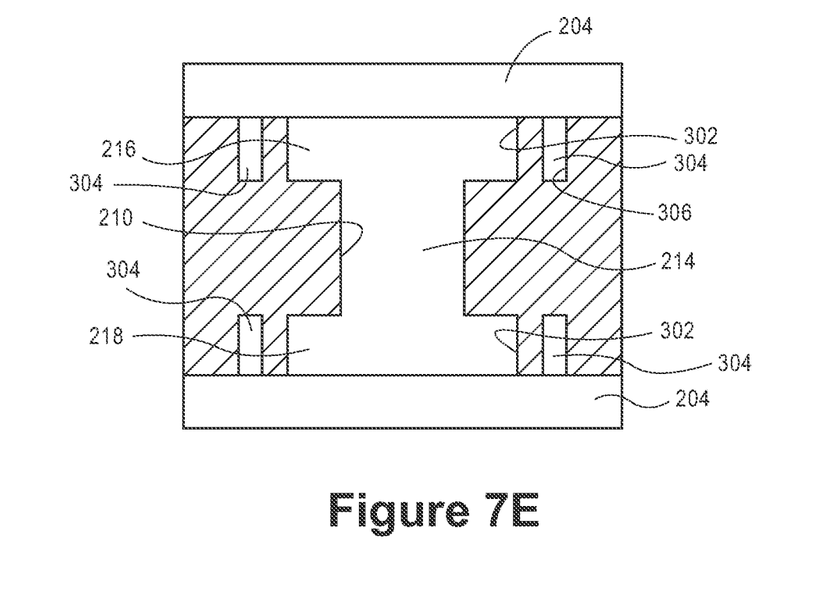

Referring to FIG. 7D, at operation 612, polymer layer 516 is pyrolyzed to form core layer 202 including polymer-derived ceramic 520. It will be appreciated that patterning of the bottom side of the stack up structure can be performed in a manner similar to that described above. Thus, core layer 202 can include counterbore 302 and blind hole 306 in an upper region, through-hole 210 in a middle region, and another counterbore 302 and blind hole 306 in a lower region. The features of core layer 202 produced by photolithography can be closely controlled within the micron scale, as described above.

Referring to FIG. 7E, at operation 614, electrical interconnects 304 can be formed in the features of core layer 202. For example, conductive interconnect 214 can be formed within through-hole 210. Similarly, top pad 216 can be formed within an upper counterbore 302 and bottom pad 218 can be formed within a lower counterbore 302. The electrical interconnects 304 may also include traces formed in corresponding blind holes 306 in core layer 202. Conductive pads and traces may be embedded in core layer 202 as described above. Dielectric layers 204 can be laminated over the embedded conductors 214, 216, 218, or 304, and additional buildup layers may be formed to fabricate package substrate 106. It will be appreciated that the process flow of introducing embedded traces and pads into core layer 202 may reduce core processing operations, such as dry film resist lamination for core plating. Furthermore, the embedded electrical interconnects 304 may have increased surface area exposed to the surrounding polymer-derived ceramic 520 of core layer 202. Accordingly, metal-to-ceramic adhesion between the embedded electrical interconnects 304 and core layer 202 may increase a structural integrity of package substrate 106. For example, the conductive structures described above may be formed by deposition processes. Conductors 214, 216, 218, or 304 may be formed by copper deposition within the patterned features in core layer 202. The embedded copper interconnects may be less susceptible to delamination from core layer 202 when package substrate 106 experiences temperature cycling because the copper structures have high surface contact with the surrounding polymer-derived ceramic 520. Semiconductor die 104 may be mounted on package substrate 106 and electrically connected to conductive interconnect 214 to provide semiconductor package 102, and semiconductor package 102 may be mounted on circuit board 112 to provide semiconductor package assembly 100.

Figure 8:
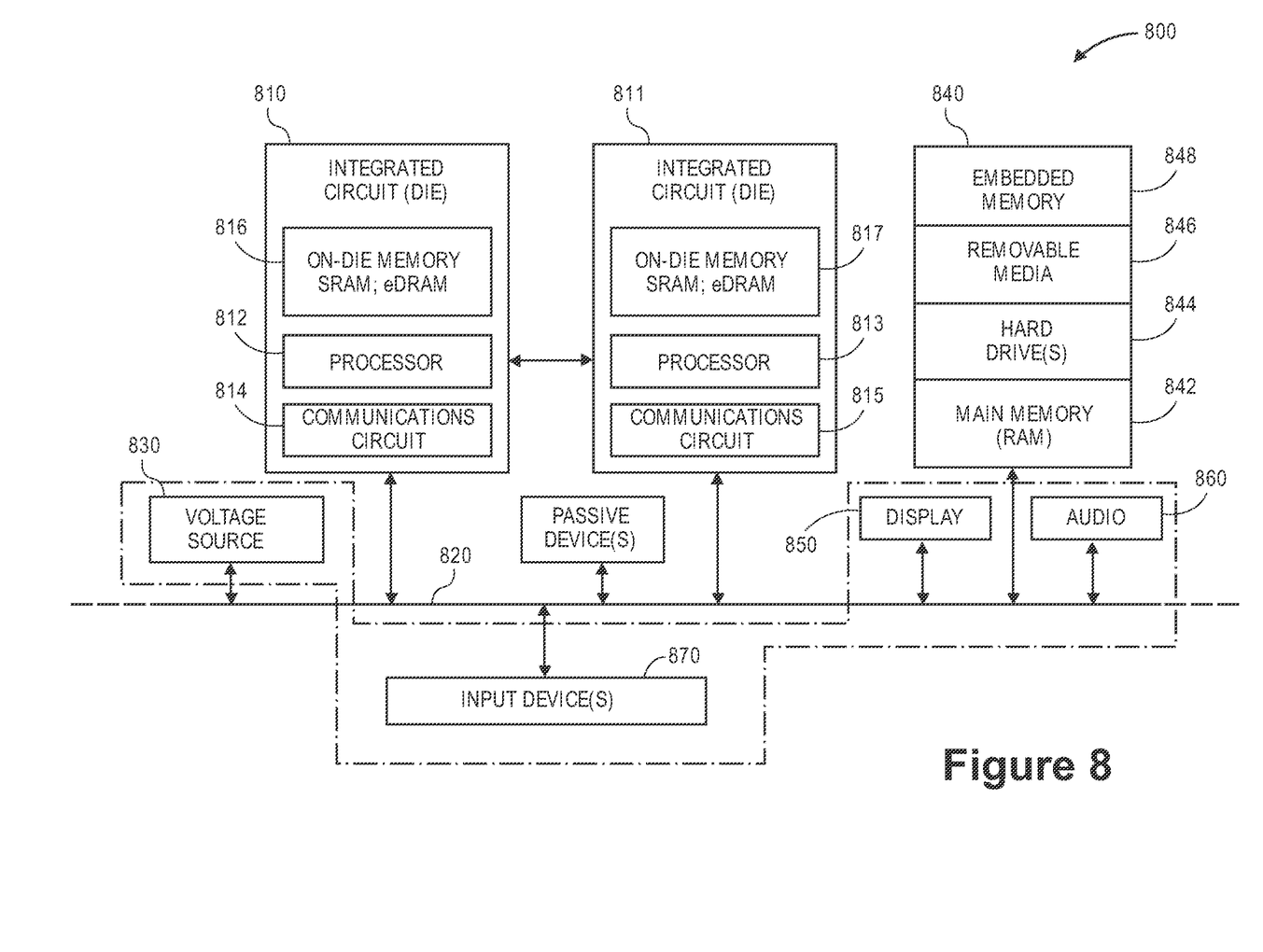
FIG. 8 is a schematic of a computer system, in accordance with an embodiment.

FIG. 8 is a schematic of a computer system, in accordance with an embodiment. The computer system 800 (also referred to as the electronic system 800) as depicted can embody a semiconductor package including a package substrate having a polymer-derived ceramic core, according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, a semiconductor package including a package substrate having a polymer-derived ceramic core, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 811 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850, and an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including a semiconductor package including a package substrate having a polymer-derived ceramic core, according to any of the several disclosed embodiments and their equivalents, an electronic system, a computer system, one or more methods of fabricating an integrated circuit, and one or more methods of fabricating an electronic assembly that includes a semiconductor package including a package substrate having a polymer-derived ceramic core, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor packages including a package substrate having a polymer-derived ceramic core embodiments and their equivalents. A foundation substrate may be included, as represented by the dashed line of FIG. 8. Passive devices may also be included, as is also depicted in FIG. 8.

Embodiments of semiconductor packages including package substrates having polymer-derived cores are described above. In an embodiment, a semiconductor package substrate includes a core layer including a polymer-derived ceramic. The core layer includes a through-hole extending from a top core surface of the core layer through the polymer-derived ceramic. The semiconductor package substrate includes a conductive interconnect in the through-hole. The semiconductor package substrate includes a dielectric layer on the top core surface of the core layer. The dielectric layer covers the conductive interconnect.

In one embodiment, the polymer-derived ceramic includes a photoinitiator.

In one embodiment, the polymer-derived ceramic includes a plurality of filler particles. The filler particles include oxides.

In one embodiment, the through-hole includes a counterbore. The conductive interconnect includes a pad in the counterbore.

In one embodiment, the pad includes a top pad surface. The top pad surface is coplanar with the top core surface.

In one embodiment, the core layer includes a blind hole extending from the top core surface into the polymer-derived ceramic. The semiconductor package substrate includes an electrical interconnect in the blind hole.

In one embodiment, the core layer has a layer thickness of less than 100 microns.

In one embodiment, the through-hole has a hole diameter of 10 microns or less.

In an embodiment, a semiconductor package includes a package substrate including a core layer including a polymer-derived ceramic. The core layer includes a through-hole extending from a top core surface of the core layer through the polymer-derived ceramic, a conductive interconnect in the through-hole, and a dielectric layer on the top core surface of the core layer. The dielectric layer covers the conductive interconnect. The semiconductor package includes a semiconductor die mounted on the package substrate. The semiconductor die is electrically connected to the conductive interconnect.

In one embodiment, the polymer-derived ceramic includes a photoinitiator.

In one embodiment, the polymer-derived ceramic includes a plurality of filler particles. The filler particles include oxides.

In one embodiment, the through-hole includes a counterbore. The electrical interconnect includes a pad in the counterbore.

In one embodiment, the core layer includes a blind hole extending from the top core surface into the polymer-derived ceramic. The semiconductor package includes an electrical interconnect in the blind hole.

In one embodiment, the through-hole has a hole diameter of 10 microns or less.

In an embodiment, a method of fabricating a package substrate having a polymer-derived ceramic core layer includes forming a precursor layer from a resin. The resin includes a plurality of polymers having functional groups attached to an inorganic backbone. The method includes exposing a first portion of the precursor layer to a light source while masking a second portion of the precursor layer from the light source. The light source activates the resin to cross-link the polymers in the first portion into a cured polymer layer. The method includes removing the resin from the second portion of the precursor layer. Removal of the second portion forms a through-hole in the polymer layer. The method includes pyrolyzing the polymer layer to form a core layer including a polymer-derived ceramic.

In one embodiment, the method includes forming a conductive interconnect in the through-hole.

In one embodiment, the polymer-derived ceramic includes a photoinitiator.

In one embodiment, the polymer-derived ceramic includes a plurality of filler particles. The filler particles include oxides.

In one embodiment, the method includes forming, from the resin, a second precursor layer over the polymer layer. The method includes exposing a third portion of the second precursor layer to the light source while masking a fourth portion of the second precursor layer from the light source. The method includes removing the resin from the fourth portion of the second precursor layer. Removing the resin from the second portion and the fourth portion forms the through-hole having a counterbore in the polymer layer.

In one embodiment, removing the resin from the fourth portion forms a blind hole in the polymer layer.

What is claimed is:
1. A semiconductor package substrate, comprising:
   a core layer including a polymer-derived ceramic, wherein the core layer includes a through-hole extending from a top core surface of the core layer through the polymer-derived ceramic;
   a conductive interconnect in the through-hole; and
   a dielectric layer on the top core surface of the core layer, the dielectric layer covering the conductive interconnect.
2. The semiconductor package substrate of claim 1, wherein the polymer-derived ceramic includes a photoinitiator.
3. The semiconductor package substrate of claim 2, wherein the polymer-derived ceramic includes a plurality of filler particles, and wherein the filler particles include oxides.
4. The semiconductor package substrate of claim 1, wherein the through-hole includes a counterbore, and wherein the conductive interconnect includes a pad in the counterbore.
5. The semiconductor package substrate of claim 4, wherein the pad includes a top pad surface, and wherein the top pad surface is coplanar with the top core surface.
6. The semiconductor package substrate of claim 5, wherein the core layer includes a blind hole extending from the top core surface into the polymer-derived ceramic; and further comprising an electrical interconnect in the blind hole.
7. The semiconductor package substrate of claim 1, wherein the core layer has a layer thickness of less than 100 microns.
8. The semiconductor package substrate of claim 1, wherein the through-hole has a hole diameter of 10 microns or less.
9. A semiconductor package, comprising:
   a package substrate including a core layer including a polymer-derived ceramic, wherein the core layer includes a through-hole extending from a top core surface of the core layer through the polymer-derived ceramic, a conductive interconnect in the through-hole, and a dielectric layer on the top core surface of the core layer, the dielectric layer covering the conductive interconnect; and
   a semiconductor die mounted on the package substrate, wherein the semiconductor die is electrically connected to the conductive interconnect.
10. The semiconductor package of claim 9, wherein the polymer-derived ceramic includes a photoinitiator.
11. The semiconductor package of claim 10, wherein the polymer-derived ceramic includes a plurality of filler particles, and wherein the filler particles include oxides.

12. The semiconductor package of claim 9, wherein the through-hole includes a counterbore, and wherein the conductive interconnect includes a pad in the counterbore.

13. The semiconductor package of claim 12, wherein the core layer includes a blind hole extending from the top core surface into the polymer-derived ceramic; and further comprising an electrical interconnect in the blind hole.

14. The semiconductor package of claim 9, wherein the through-hole has a hole diameter of 10 microns or less.

15. A method, comprising:

forming a precursor layer from a resin, wherein the resin includes a plurality of polymers having functional groups attached to an inorganic backbone;

exposing a first portion of the precursor layer to a light source while masking a second portion of the precursor layer from the light source, wherein the light source activates the resin to cross-link the first portion into a cured polymer layer;

removing the resin from the second portion of the precursor layer, wherein removal of the second portion forms a through-hole in the polymer layer; and pyrolyzing the polymer layer to form a core layer including a polymer-derived ceramic.

16. The method of claim 15 further comprising forming a conductive interconnect in the through-hole.

17. The method of claim 15, wherein the polymer-derived ceramic includes a photoinitiator.

18. The method of claim 17, wherein the polymer-derived ceramic includes a plurality of filler particles, and wherein the filler particles include oxides.

19. The method of claim 15 further comprising:

forming, from the resin, a second precursor layer over the polymer layer;

exposing a third portion of the second precursor layer to the light source while masking a fourth portion of the second precursor layer from the light source;

removing the resin from the fourth portion of the second precursor layer, wherein removing the resin from the second portion and the fourth portion forms the through-hole having a counterbore in the polymer layer.

20. The method of claim 19, wherein removing the resin from the fourth portion forms a blind hole in the polymer layer.

* * * * *